United States Patent [19]

Iredale

[11] Patent Number: 4,670,709

[45] Date of Patent: Jun. 2, 1987

[54] PORTABLE AUDIO SYSTEM AND AUDIO CABLE CONTINUITY TESTER

[76] Inventor: John Iredale, 8150 SW. 54th Ave., Miami, Fla. 33141

[21] Appl. No.: 595,341

[22] Filed: Mar. 30, 1984

[51] Int. Cl.⁴ ............................................. G01R 31/02
[52] U.S. Cl. .................................. 324/73 R; 324/51; 324/115; 324/133
[58] Field of Search ............... 324/73 R, 115, 133, 324/527, 543, 544, 57 R

[56] References Cited

U.S. PATENT DOCUMENTS 2,732,491 1/1956 Jeannot .............................. 324/73 R
3,462,689 8/1969 Fenton ............................... 324/73 R

*Primary Examiner*—Ernest F. Karlsen

[57] ABSTRACT

A portable battery powered tone source with a built-in audio cable tester. Plural outputs consist of −40 dB, mic level; −10 dB line level and 1W speaker level. Continuity in the system under test from input to speakers causes an audio frequency signal to be present at speakers. This systems own speakers can be used as monitors in the testing process. Moving the device (source) enables the user to audibly locate the point at which the continuity starts/stops. At such time the user can test the audio castle at that point. The various plugs of the device are compatible with all common audio jacks enabling the user to test all types of audio equipment as well as all types of audio cables with only one device. The device can also be used to test any direct point-to-point connection such as common ground or a PC board run with a simple test lead adaptor.

1 Claim, 2 Drawing Figures

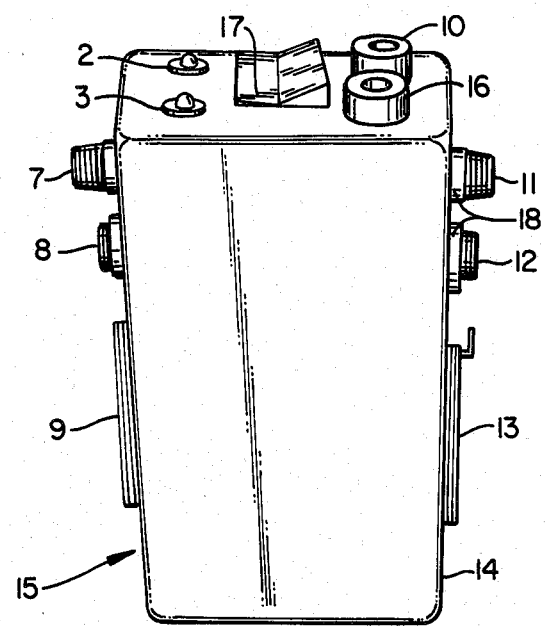
FIG._1.
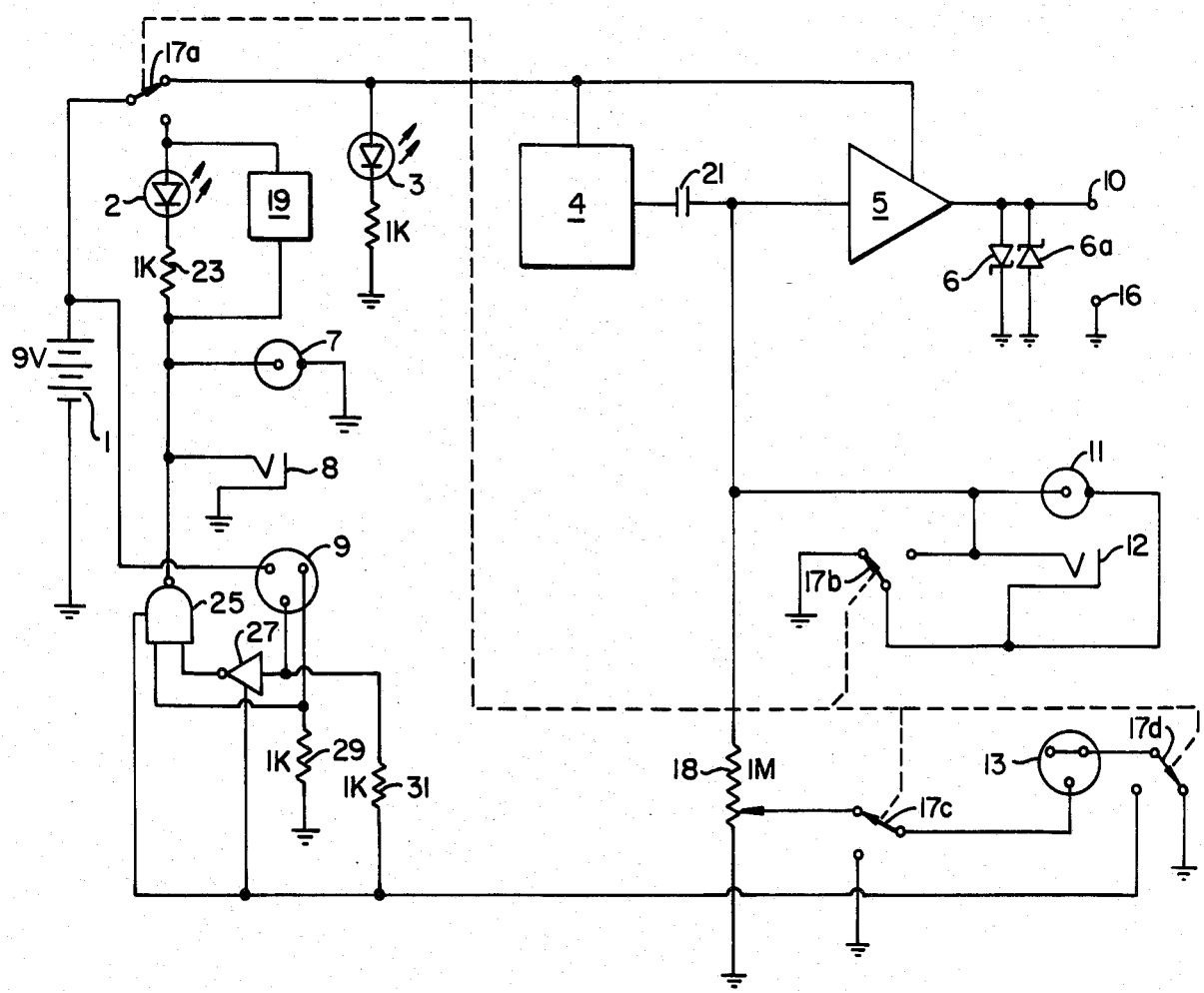
FIG._2.

PORTABLE AUDIO SYSTEM AND AUDIO CABLE CONTINUITY TESTER

BACKGROUND OF THE INVENTION

This invention relates generally to electrical testing devices and, more particularly, to audio test equipment.

In the audio industry it is common to use a typical oscillator/frequency generator as a signal source for testing continuity of audio systems or subsystems. These devices deliver accuracy; however, this is not a factor as a test tone need not be an exact frequency or amplitude. These units are also large, heavy, costly and often fragile. Also having only line level outputs, they cannot drive all inputs which may need to be driven in order to test a given system or path. Without portability these devices have limited usefullness.

Also it has been necessary to carry two or more devices to test all phases of the audio system for continuity; (1) tone generator for testing components of the system or a series of components, (2) a cable tester to further locate the point of loss of continuity, and (3) an ohmmeter to test point-to-point continuity (such as a PC board run or common ground points).

There is, therefore, a need in the audio industry for a device that is a combination tone source-cable tester-continuity tester, that is pocket sized and battery powered for portability with plural outputs and various audio jacks enabling the user to drive any input or test any cable found in the audio environment.

SUMMARY OF THE INVENTION

The present invention provides portable audible and visual means with which to test audio systems. Included are an oscillator buffered to be compatible with high impedance inputs of audio equipment, a high powered amplifier output to drive speakers directly, and an output compatible with a balanced signal input. Also the invention provides an audio cable tester which tests all common audio cables including phase testing of three conductor mic cables. The tester can be used in a test tone mode as a tone source or in a cable continuity mode to test any audio cable for shorts and opens, plus incorrect pin polarity in three conductor mic cables.

BRIEF DESCRIPTION OF THE DRAWINGS

FIG. 1 shows a preferred embodiment of the inventive audio system continuity tester.

FIG. 2 shows a schematic diagram of the internal circuitry of the audio system continuity tester.

DESCRIPTION OF THE PREFERRED EMBODIMENT

FIG. 1 shows a preferred embodiment of the inventive audio system continuity tester as a portable self-contained unit 15. Tester 15 is contained in a $2\frac{1}{2} \times 4\frac{1}{2} \times 1\frac{1}{2}$ inch box made of cast aluminum or any other conducting material so that a chassis ground is available for the internal circuitry. On the top of tester 15 are located red LED 3, which lights when tester 15 is turned on, green LED 2, black banana plug 16, red banana plug 10, and four-pole dual-throw rocker switch 17 of the on-on type. On one narrow side of tester 15 are one of each of the standard audio plugs; namely, phono jack 7, ¼ inch phone jack 8, and female LCR connector 9; on the opposite side of tester 15 are one of each of the corresponding standard audio plugs; namely, phono jack 11, ¼ inch phone jack 12, and male LCR connector 13. Phono jack 11 and ¼ inch phone jack 12 are isolated from chassis ground by insulative washers 18 the remaining standard audio plugs are not isolated from chassis ground.

A schematic of the internal circuitry of tester 15 is shown in FIG. 2 and includes 9 volt battery 1, function generator 4 (which may be of type 8038 as manufactured by Intersil), power amplifier 5 (which may be of type 1454), 10 volt Zener diodes 6 and 6a, 1M trimpot 18, resistors 23, 29, 31, capacitor 21, and buzzer 19, inverter 27, and NAND-gate 25.

Tester 15 operates in two modes: the test tone mode and the cable test mode. The test tone mode provides an approximately 1 kHz signal in two forms: one to drive the high impedance input of audio equipment (−10 dB for line level and −40 dB for mic level) and the other to directly drive speakers and operates as follows. The first pole of switch 17, which is labelled 17a, connects battery 1 with LED 3, function generator 4, and power amplifier 5, thereby energizing these devices. Function generator 4 is connected so that an approximately 1 kHz sinewave of 0.245 volt amplitude is output. The output of function generator 4 is input through 1 uf capacitor 21 to power amplifier 5 which in turn provides a low-impedance, speaker-level, limited output at banana plug 10. Zener diodes 6 and 6a limit the amplitude of the output of power amplifier 5 to a range of from −5 volts to +5 volts. The output at banana plug 10 is used to directly drive a speaker to be tested; the low output impedance of power amplifier 5 approximately matches the input impedance of a speaker. Banana plug 16 is used to connect chassis ground to external ground.

The output of function generator 4 is also directly connected through 1 uf capacitor 21 to the positive leads of phono jack 11 and ¼ inch phone jack 12 and also to trimpot 18. The second pole of switch 17, 17b, connects the ground terminals of phono jack 11 and ¼ inch phone jack 12 to chassis ground. The trimmed signal from trimpot 18 is connected by the third pole of switch 17, 17c, to pin 3 of male LCR connector 13 to achieve −40 dB (mic level), and the fourth pole of switch 17, 17d, grounds both pins 1 and 2 of LCR connector 13 creating single phase output. Thus the output of function generator 4 effectively appears on the positive leads of phono jack 11 and ¼ inch phone jack 12 plus on pin 3 of LCR connector 13, and these three outputs may be used to test high input impedance audio equipment.

The cable test mode is used to test for continuity and shorts in audio cables and operates as follows: first switch 17 is in the off/continuity position. The cable to be tested is connected to the appropriate one of phono jack 7, ¼ inch phone jack 8, or female LCR connector 9. The opposite end of the cable is left unconnected. Thus the first pole, 17a, connects battery 1 through LED 2, 1K resistor 23, and buzzer 19 (which may be of type P9925-ND) to the positive leads of phono jack 7 and ¼ inch phone jack 8; the circuit operation for LCR connector 9 will be described below. Thus if a short in the cable connected to jacks 8 or 9 exists, then current will flow and light LED 2 plus sound buzzer 19. If no short is detected, then continuity is tested as follows.

The unconnected end of the cable connected to jacks 8 or 9 and being tested is now connected to the appropriate one of phono jack 11 and ¼ inch phone jack 12. Because switch 17 had been thrown from the test tone mode, the second pole, 17b, now connects the positive lead to the ground terminal of phono jack 11 and ¼ inch phone jack 12. Thus continuity is detected by LED 2 lighting and buzzer 19 sounding as follows: if the cable being tested is connected from phono jack 7 to phono jack 11, then current flows in the circuit consisting of battery 1, switch 17a, LED 2, resistor 23, (or buzzer 19 in parallel), positive lead of phono jack 7, positive lead of cable being tested, positive lead of phono jack 11, switch 17b, ground terminal of phono jack 11, ground terminal of cable being tested, ground terminal of phono jack 7, and ground. Similarly, if the cable being tested is connected between ¼ inch phone jack 8 and ¼ inch phone jack 12, then the circuit is battery 1, LED 2, resistor 23, (or buzzer 19 in parallel), positive lead of ¼ inch phone jack 8, positive lead of cable being tested, positive lead of ¼ inch phone jack 12, switch 17b, ground terminal of ¼ inch phone jack 12, ground terminal of cable being tested, ground terminal of ¼ inch phone jack 8, and ground.

The LCR connectors are in a separate circuit which will simultaneously test for continuity, shorts, and phasing. If the cable being tested is connected between LCR connector 9 and LCR connector 13, the circuit operates as follows. Pull 17a, in the cable test mode, connects the positive terminal of battery 1 to LED to resistor 23 (or buzzer 19 in parallel) to the output of NAND-gate 25. Pin 1 of LCR connector 9 is directly connected to the positive side of battery 1, pin 2 is connected to one of the inputs of NAND-gate 25, and pin 3 is connected, through inverter 27, to the other input of NAND-gate 25. LCR connector 13 has pin 3 grounded by switch 17c, and pins 1 and 2 are connected to the bias inputs of NAND-gate 25 and inverter 27. Thus if cable line 1 is continuous the battery output appears at the bias of NAND-gate 25 and inverter 27, thereby activating them; and if cable line 2 is continuous then the pin 1 to pin 2 connection at LCR connector 13 means that pin 2 of LCR connector 9 is also at +9 volts and provides a high input to NAND-gate 25 (note that 1K resistor 29 provides a tie-down); and if cable line 3 is continuous then the ground of pin 3 of LCR connector 13 by switch 17c means that pin 3 of LCR connector 9 is also at ground and provides a low input to inverter 27 which in turn provides a high input to NAND-gate 25; consequently, if all three lines of the cable being tested are continuous the output of NAND-gate 25 will be low and will sink current flowing from battery 1 through LED 2, resistor 23 (or buzzer 19 in parallel), thereby lighting LED 2 and sounding buzzer 19. Conversely, if cable line 1 is open NAND-gate 25 is off and will no sink current so that LED 2 and lever 19 will not be activated; similarly, if cable lne 2 is open then the corresponding input to NAND-gate 25 is low (being grounded by resistor 29) and the output of NAND-gate 25 will be high (or in open circuit) thereby preventing current flow through LED 2 and buzzer 19; lastly, if cable line 3 is open then the input to inverter 27 will be high because tie-up resistor 31 will not draw any current due to the high input impedance of inverter 27, and then the output of inverter 27 will be low so that the output of NAND-gate 25 will be high, again preventing current flowing through LED 2 and buzzer 19. Also: any short between conductors to pin 3 will disrupt the chain of events necessary to light LED 2 and sound buzzer 19; likewise, reversed conductors between pins of LCR connectors will also fall to light LED 2 and sound buzzer 19.

What is claimed is:

1. A portable test tone generator and audio cable tester, comprising:

(a) a housing,
 (b) a first phono jack having a positive lead, a first ¼ inch phone jack having a positive lead, and a first LCR connector having pins 1, 2 and 3 all mounted on a first portion of said housing,
 (c) a second phono jack having a positive lead, a second ¼ inch phone jack havng a positive lead, and a mating LCR connector having pins 1, 2 and 3 all mounted on a second portion of said housing, daid second phono jack and said second ¼ inch phone jack insulated from said housing.
 (d) a four pole dual throw switch mounted on said housing,
 (e) first and second plugs mounted on said housing,
 (f) a power supply, a current indicator, an inverter, a NAND-gate, a function generator, and a power amplifier all mounted within said housing,
 (g) wiring means within said housing so that
  (i) when said switch is in a first position said function generator is activated by said power supply and outputs a test signal to the input of said power amplifier, to the positive lead of said second ¼ inch phone jack, and to pins of said mating LCR connector: and said power amplifier is activated by said power supply and outputs a test signal to said first plug; and
  (ii) when said switch is in the other position said second phono jack has its positive lead connected to its ground terminal; said second ¼ inch phone jack has as its positive lead connected to its ground terminal;

said mating LCR connector has pins 1 and 2 connected to bias pins of said inverter and NAND-gate and pin 3 is grounded; said first phono jack has its positive lead connected to said current indicator and power supply; said first ¼ inch phone jack has its positive lead connected to said current indicator and power supply; said first LCR connector has pin 1 connected to said power supply output, pin 2 connected to a tie-down resistor and to one input of said NAND-gate, and pin 3 connected to an input of said inverter; the output of said inverter is connected to another input of said NAND-gate; and an output of said NAND-gate is connected to said current indicator and said power supply.

* * * * *